US011296483B2

(12) United States Patent
Rakuljic

(10) Patent No.: US 11,296,483 B2
(45) Date of Patent: Apr. 5, 2022

(54) METHODS AND APPARATUS TO CONTROL THE OPTICAL FREQUENCY OF A LASER

(71) Applicant: Intel Corporation, Santa Clara, CA (US)

(72) Inventor: George Rakuljic, Santa Monica, CA (US)

(73) Assignee: Intel Corporation, Santa Clara, CA (US)

( * ) Notice: Subject to any disclaimer, the term of this patent is extended or adjusted under 35 U.S.C. 154(b) by 215 days.

(21) Appl. No.: 16/577,902

(22) Filed: Sep. 20, 2019

(65) Prior Publication Data

US 2020/0021082 A1    Jan. 16, 2020

(51) Int. Cl.
| G01C 3/08 | (2006.01) |
| H01S 5/0687 | (2006.01) |
| H01S 5/40 | (2006.01) |
| G01S 7/491 | (2020.01) |
| H01S 5/026 | (2006.01) |
| G01S 17/32 | (2020.01) |

(52) U.S. Cl.
CPC ............ *H01S 5/0687* (2013.01); *G01S 7/491* (2013.01); *G01S 17/32* (2013.01); *H01S 5/0261* (2013.01); *H01S 5/0264* (2013.01); *H01S 5/4012* (2013.01)

(58) Field of Classification Search
CPC .... H01S 5/0687; H01S 5/0261; H01S 5/0264; H01S 5/4012; G01S 7/491; G01S 17/32
See application file for complete search history.

(56) References Cited

U.S. PATENT DOCUMENTS

| 5,163,888 A | * | 11/1992 | Stearns | ............... A63B 21/015 482/110 |
| 7,995,630 B2 | | 8/2011 | Rakuljic | |
| 8,175,126 B2 | | 5/2012 | Rakuljic et al. | |
| 2003/0103213 A1 | | 6/2003 | Adams | |
| 2013/0308663 A1 | | 11/2013 | Chen et al. | |

FOREIGN PATENT DOCUMENTS

| DE | 10353908 | * | 6/2005 | ........... H01S 3/1304 |
| JP | 2000151000 | | 5/2000 | |
| JP | 2000275107 | | 10/2000 | |
| JP | 2017191815 | | 10/2017 | |

OTHER PUBLICATIONS

International Searching Authority, "International Search Report and Written Opinion," issued in connection with PCT application No. PCT/US2020/046789, dated Nov. 27, 2020. (9 pages).

* cited by examiner

*Primary Examiner* — Mark Hellner
(74) *Attorney, Agent, or Firm* — Hanley, Flight & Zimmerman, LLC

(57) ABSTRACT

Methods and apparatus to control the optical frequency of a laser are disclosed. An apparatus includes: a first laser to emit a first beam of light, the first beam of light to have an adjustable frequency based on an input current; a second laser to emit a second beam of light, the second beam of light to have a substantially fixed frequency; a photodetector to generate a feedback signal indicative of a frequency difference between the first and second beams of light; and logic circuitry to control the input current based on the feedback signal.

25 Claims, 5 Drawing Sheets

US 11,296,483 B2

METHODS AND APPARATUS TO CONTROL THE OPTICAL FREQUENCY OF A LASER

FIELD OF THE DISCLOSURE

This disclosure relates generally to lasers, and, more particularly, to methods and apparatus to control the optical frequency of a laser.

BACKGROUND

A feedback loop enables the precise control of a system by monitoring the output of the system, comparing the output to some reference parameter to determine an error, and then updating the system based on the error. Controlling the optical frequency output by a laser using a feedback loop is difficult because the optical frequency of a laser is significantly higher than the operational bandwidth of many electronic components that might otherwise be employed. For instance, photodetectors are capable of directly measuring optical signals at frequencies in the range of tens of gigahertz and possibly as high as hundreds of gigahertz (e.g., $10^{11}$ Hz). However, the optical frequency of a laser (and all light in the visible or near visible spectrum) is in the range of hundreds of terahertz (e.g., $10^{15}$ Hz). Because most electronic components have a frequency response with an upper limit that is considerably lower than the optical frequency of lasers, such components cannot directly measure the optical frequency of lasers with sufficient accuracy to determine errors relative to a reference parameter needed for a control loop.

Figure 1:
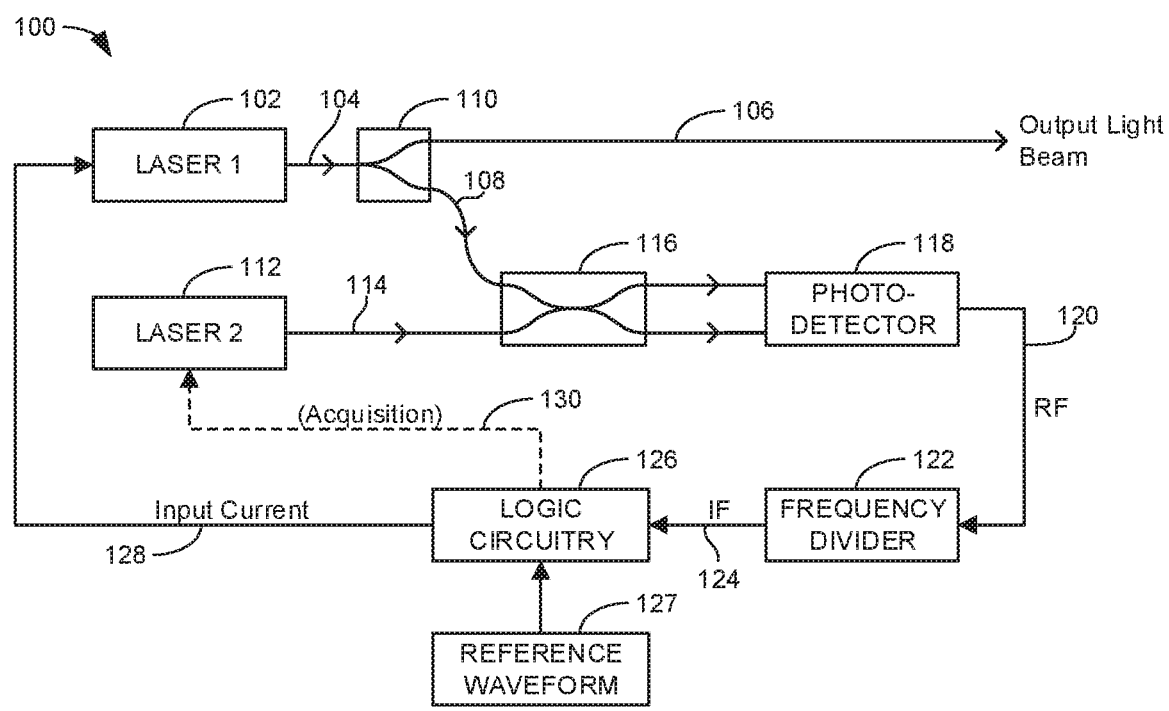
FIG. 1 is a block diagram of an example laser control system constructed in accordance with teachings disclosed herein.

The figures are not to scale. Instead, the positions and/or thickness of the components may be enlarged in the drawings. In general, the same reference numbers will be used throughout the drawing(s) and accompanying written description to refer to the same or like parts. As used in this patent, stating that any part (e.g., a layer, film, area, region, structure, or plate) is in any way on (e.g., positioned on, located on, disposed on, or formed on, etc.) another part, indicates that the referenced part is either in contact with the other part, or that the referenced part is above the other part (relative to the earth) with one or more intermediate part(s) located therebetween. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Stating that any part is in "contact" with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

The optical frequency of a laser is dependent on the electrical current driving the laser. Thus, a change in current (e.g., an increase in Amperes) provided to a laser results in a change in the optical frequency of a laser beam output by the laser. However, the relationship between current and frequency is not necessarily linear. Further, laser emissions are very sensitive to both electronic noise and spurious optical power. Due to this non-linearity and high sensitivity, it is very difficult to precisely control the optical frequency of a laser. One option is to control the laser using a control loop in which the optical frequency of the laser beam output by the laser is measured and compared to a target reference value and then the electrical current driving the laser is adjusted either up or down depending on any deviation between the optical frequency of the laser and the reference value. By changing the reference value, it is possible to precisely modulate the optical frequency of the laser output in any desired manner. Unfortunately, controlling a laser in this manner is much easier said than done. The optical frequency of light is too high to be measured directly using currently available technology. As a result, it is not possible to control the optical frequency of a laser based on direct measurements of the optical frequency.

While optical frequency cannot be measured directly, it is possible to indirectly measure the optical frequency of a laser. In particular, one approach to indirectly measure the optical frequency of a laser is through the use of a Mach-Zehnder interferometer. A Mach-Zehnder interferometer is a mechanical device that splits a single source of collimated light (e.g., a laser) into two beams of light that travel along separate paths of different lengths before being subsequently crossed with each other to produce interference. To indirectly measure the optical frequency of a laser, one of the two signal paths for the light beam within the interferometer is constructed to be significantly longer than the other signal path, thereby producing a time delay between the two paths leading to a photodetector (e.g., a photo diode). For example, both paths may include optical fibers with the shorter path being less than 1 inch long and the longer path being over 30 feet long. A Mach-Zehnder interferometer constructed in this manner (with a long delay line in one signal path for the split beam of light), acts as an optical frequency discriminator that converts the optical frequency of the laser into a corresponding amplitude value. The output of the interferometer can be measured by the aforementioned photodetector and used as a feedback signal in a control loop to precisely control the optical frequency of the output of the laser based on modifications to the electrical current driving the laser.

While a Mach-Zehnder interferometer can be used to reliably control the optical frequency of a laser, such interferometers are difficult and costly to manufacture. Among other things, it is difficult to manufacture the long delay line of the interferometer on a solid state or monolithic integrated circuit. Rather, the long delay line is typically manufactured by tightly wrapping an optical fiber of the desired length (e.g., 30 feet) into a coil to reduce the overall formfactor of the interferometer. The ends of the fiber are coupled to other electronic components (which may be formed in an integrated circuit). Not only is a long coiled fiber difficult to manufacture, there are additional complexities in coupling the optical fiber to the other components in the system (e.g., a laser and photodetector at either end of the fiber).

Examples disclosed herein overcome the above challenges by enabling precise control of the optical frequency of a laser using components that may be entirely manufactured within a single monolithic integrated circuit. That is, examples disclosed herein measure and control the optical frequency of the output beam of a laser without using an interferometer having a long delay line. For purposes of explanation, as used herein, the term "long delay line" for an interferometer is defined to be a signal path in the interferometer that is at least twice as long as the second signal path of the interferometer.

In some examples, the optical frequency of a laser is indirectly measured (to enable precise control of the same) by measuring the heterodyne frequency produced by combining the output of the laser with a second beam of light output by a second laser operating at a substantially fixed or constant optical frequency that serves as a reference or baseline. As used herein, the terms "substantially fixed" and "substantially constant" used in connection with frequency means a frequency that remains within +/−1% of the intended value of the frequency. The heterodyne frequency that is measured from the output of combining the two light beams corresponds to a difference in frequency between the two beams of light, which is also known as the beat frequency of the two beams of light. While both light beams have optical frequencies in the range of hundreds of terahertz (e.g., 10^15 Hz), in some examples, the substantially fixed optical frequency of the second laser is set to within a nominal range or threshold (e.g., +/−10 GHz, +/−20 GHz, +/−50 GHz, +/−100 GHz) of the optical frequency of the first laser such that the difference or beat frequency is within a frequency bandwidth that can be adequately sensed by currently available electronic components, such as a photodetector. In some examples, the nominal frequency range between the two lasers is set such that the beat frequency will be within the radio frequency spectrum (e.g., within 30 Hz and 300 GHz). Inasmuch as the optical frequency of the second laser is substantially fixed, any change in the sensed beat frequency equals a corresponding change in the optical frequency of the first laser. Thus, by measuring the beat frequency of the two lasers, changes to the optical frequency of the first laser can be determined. By feeding a measurement indicative of these change(s) into a control loop, the optical frequency of the first laser can be controlled as explained in greater detail below.

FIG. 1 is a block diagram of an example laser control system 100 constructed in accordance with teachings disclosed herein. As shown in the illustrated example, the system 100 includes a first laser 102 that produces a frequency modulated beam of light 104 (also referred to herein as a controlled beam of light) associated with a variable optical frequency that may be precisely controlled. This first laser is the source laser from which an output to the external environment of the system is desired. In some examples, the first laser 102 is a semiconductor laser. As described more fully below, the optical frequency of the controlled beam of light 104 may be varied or controlled through the implementation of a control loop. In some examples, to implement the control loop, the example system 100 includes means for splitting the controlled beam of light between first and second portions 106, 108 (e.g., an output portion and a sample portion). In the illustrated example of FIG. 1, the means for splitting the controlled beam of light 104 is an optical splitter 110 (e.g., a 90/10 splitter). In other examples, the means for splitting the controlled beam of light 104 includes an optical coupler or beam splitter. In the illustrated example, the first portion 106 of the controlled beam of light 104 serves as an output beam of the system 100 that is directed to the external environment (e.g., the environment outside the system 100). The second portion 108 of the controlled beam of light 104 (e.g., the sample portion) is used in the control loop to determine the optical frequency of the controlled beam of light 104. This sample portion is used by the control system to adjust the beam 104 as needed to control the optical frequency of the beam of light 104 to match a desired reference waveform. In some examples, the first portion 106 of the controlled beam of light 104 (e.g., the output portion) corresponds to a substantial majority (e.g., 90%, 95%, 99%) of the beam of light 104 whereas the second portion 108 (e.g., the sample portion) is a relatively small fraction (e.g., 10%, 5%, 1%) of the beam of light 104.

As shown in the illustrated example, the laser control system 100 includes a second laser 112 (e.g., a reference laser) that produces a continuous waveform beam of light 114 (also referred to herein as a baseline beam of light) associated with a substantially fixed optical frequency that serves as a baseline for comparison with the controlled beam of light 104. As used herein, a "continuous waveform" beam of light is a beam of light that has a substantially constant or fixed optical frequency and a substantially constant or fixed amplitude. In some examples, the frequency and/or amplitude of the continuous waveform beam of light 114 need only be fixed during implementation of the control loop. That is, in some examples, the particular frequency at which the continuous waveform beam of light 114 is fixed (e.g., the particular baseline) may be adjusted up or down to different values during an initiation sequence (often referred to as an acquisition process) before the control loop begins controlling the controlled beam of light 104. In some examples, the second laser 112 is a semiconductor laser.

In the illustrated example of FIG. 1, the second (e.g., sample) portion 108 of the controlled beam of light 104 and the baseline beam of light 114 are input to means for combining the light beams. As used herein, "combining" light beams means joining separate input light beams into a common output optical signal path. In some examples, "combining light" associated with two input light beams may involve joining separate portions of the two beams into separate corresponding output optical signal paths. In this example, the means for combining light is implemented by an optical combiner 116, such as a 2×2 optical coupler. However, in other examples, the means for combining light may be implemented by any other suitable optical combiner including one or more couplers and/or one or more beam splitters. As shown in the illustrated example, the optical combiner 116 includes two inputs and two outputs. Both outputs will contain combined portions of light from each of the second (e.g., sample) portion 108 of the controlled beam of light 104 and the baseline beam of light 114. The combined beams of light output by the combiner 116 are directed to a photodetector 118 that functions as an optical mixer to mix the two beams of light 108, 114 to generate a radio frequency (RF) output signal 120. The RF output signal 120 corresponds to the frequency difference between the sample beam of light 108 and the baseline beam of light 114. This frequency difference is referred to as the heterodyne beat frequency of the two beams of light 108, 114.

In some examples, the laser control system 100 includes means for generating a feedback signal indicative of the frequency difference (e.g., the beat frequency) of the two beams of light 108, 114. In the illustrated example, the means for generating the feedback signal is implemented by the photodetector 118, but any other type of optical receiver could alternatively be used. In such examples, the RF output signal 120 generated by the photodetector 118 corresponds to the feedback signal. In some examples, the photodetector 118 is a balanced photodetector. A balanced photodetector includes two photodiodes that produce outputs that are subtracted from one another to improve signal-to-noise ratio (SNR). In other examples, the photodetector is implemented with a single photodiode. In the illustrated example, the photodetector 118 converts the optical signal received from the optical combiner 116 into an electrical signal (e.g., the RF output signal 120) that oscillates at the heterodyne beat frequency of the two beams of light 108, 114. In some examples, a first one of the two outputs of the optical combiner 116 is terminated at or before the photodetector 118 with the second optical output being used as the basis for generated the RF output signal 120. Thus, in this example, the signal 120 output by the photodetector 118, which can be a single element photodetector, is only generated based the second output of the optical combiner 116. As mentioned above, the RF output signal 120 generated by the photodetector 118 is also referred to herein as a feedback signal 120 because it serves as the feedback used in the control loop to adjust the optical frequency of the first laser 102.

As mentioned above, the optical frequency of visible and near-visible light is in the range of 100s of terahertz, which is well beyond the frequency response range of existing photodetectors. However, so long as the difference between frequencies of the two beams of light 108, 114 are kept within a threshold distance of each other that is within the frequency bandwidth of the photodetector 118, the photodetector 118 will be able to sense the beat frequency (or frequency difference) of the two beams of light. In other words, the threshold distance between the difference between the frequency of the sample laser beam 108 and the frequency of the baseline laser beam 114 must be within the detectable range of the photodetector. The particular range of detectable frequencies may depend on the cost and/or quality of the photodetector, but are typically limited to frequencies no higher than radio frequencies (e.g., less than 300 GHz) such that the output of the photodetector is within the radio frequency range as indicated by the label "RF" in the illustrated example. In some examples, the difference between the frequencies of the two beams of light is confined to the lower end of the radio frequency spectrum (e.g., less than 100 GHz, less than 50 GHz, less than 10 GHz. etc.).

As described above, the baseline beam of light 114 emitted by the second (e.g., reference) laser 112 operates at a substantially constant or fixed optical frequency (e.g., a continuous waveform). The baseline beam of light 114 serves as a baseline for comparison with the optical frequency of the sampled beam of light 108. The output of the first laser 102 may be adjusted up or down in response to an input current controlled by the control loop. As such, for the difference of frequencies between the two beams of light 114 to remain within the radio frequency spectrum (or other threshold difference less than the full radio frequency spectrum), the variability in the optical frequency of the first laser 102 must be within the threshold distance of the baseline frequency of the baseline beam of light 114. In some examples, when the control system is initially turned on, the frequency of the controlled beam of light 104 may be outside this threshold. In such examples, an acquisition process may be implemented to adjust the baseline frequency of the baseline beam of light 114 and/or to adjust the frequency of the controlled beam of light 104 until the two frequencies are brought within the threshold distance defined for the system 100.

While the beat frequency of the two beams of light 104, 114 may be within a bandwidth that the photodetector 118 is capable of sensing, the beat frequency (and, therefore, the corresponding frequency of the feedback signal 120 output by the photodetector 118) may be higher than desired for subsequent processing. Accordingly, in some examples, the laser control system 100 includes means for reducing the frequency of the feedback signal 120 to a reduced feedback signal 124 associated with an intermediate frequency (indicated by the label "IF" in FIG. 1). In some examples, the means for reducing is implemented by a frequency divider 122 such as a divide-by-N circuit and/or any other type of logic circuit able to produce a signal having a lower frequency than the frequency of the input signal. In the illustrated example, the frequency divider 122 is triggered when the frequency of the feedback signal 120 satisfies a threshold. That is, in some examples, if the frequency of the feedback signal 120 exceeds a threshold, the frequency divider 122 will reduce the frequency to produce the reduced feedback signal 124. However, if the frequency of the feedback signal does not exceed the threshold, the frequency divider 122 will not operate on the feedback signal 120. In some examples, the means for reducing (e.g., the frequency divider 122) may be omitted entirely from the laser control system 100.

As shown in the illustrated example of FIG. 1, the reduced feedback signal 124 produced by the frequency divider 122 (or the feedback signal 120 produced by the photodetector 118 when the frequency divider 122 is not used) is passed to means for controlling the first laser 102. In the illustrated example, the controlling means is implemented by example logic circuitry 126 such as a processor, a controller, etc. In some examples, the means for controlling includes a means for comparing. In some examples, both the means for controlling and the means for comparing are implemented by a common processor, controller, and/or other logic circuit. In other examples, the means for controlling is implemented by a processor, controller, and/or other logic circuit and the means for comparing is implemented by separate comparator. In the illustrated example, the logic circuitry 126 compares either the initial feedback signal 120 or the reduced feedback signal 124 (both of which contain the same information indicative of the beat frequency of the two beams of light 104, 114) to a reference waveform 127 defined for the first laser 102. Although the illustrated example shows the reference waveform 127 as external and provided to the logic circuitry 126, in some examples, the reference waveform 127 corresponds to a digital data file stored in memory associated with the logic circuitry 126.

In some examples, the reference waveform may be set to a substantially constant frequency. In other examples, the reference waveform may define a change in frequency over time in any suitable manner. That is, the reference waveform may be a frequency modulated waveform. For example, the reference waveform may be a linear frequency chirp for the first laser 102, a quadratic frequency chirp for the first laser 102, an exponential frequency chirp for the first laser 102, etc. If the frequency of the reference waveform changes with time, as the logic circuitry 126 compares the beat frequency of the two laser beams 108, 114 (indicated by feedback signals 120, 124) to the reference waveform 127 in substantially real-time, the output of the logic circuitry 126 will reflect a corresponding increase or decrease in a deviation or difference between the beat frequency and the reference waveform unless the beat frequency is adjusted to following the reference waveform. That is, if the first laser 102 is operating in accordance with the reference waveform, the change in the beat frequency of the two beams of light 104, 114 over time (sensed by the photodetector 118) should match the corresponding change in the frequency defined by the reference waveform. Accordingly in some examples, when the logic circuitry 126 identifies a deviation or error in the comparison (e.g., the beat frequency does not match the reference waveform), the logic circuitry 126 adjusts (e.g., increases or decreases) an input current 128 by an amount corresponding to the difference that is provided to the first laser 102 to drive the output of the laser to match the corresponding change in the frequency defined by the reference waveform 127. Monitoring the controlled beam of light 104 output by the first laser 102 with the photodetector 118, as described above, to produce the feedback signal 120 that is fed into the logic circuitry 126 enables the precise control of the laser 102 in substantially real-time.

In some examples, the frequency difference between the first laser 102 and the second laser 112 may be greater than the upper limit of the frequency bandwidth capable of being sensed by the photodetector 118 when the control system 100 is first initiated (e.g., when the first laser 102 is initially turned on). In some such examples, the logic circuitry 126 may implement an acquisition process during which the optical frequency of the second laser 112 is adjusted to bring the frequencies of both beams of light 108, 114 to within a threshold distance of each other that is within the bandwidth of the photodetector 118. Accordingly, as shown by the dashed line in the illustrated example of FIG. 1, the logic circuitry 126 may produce a separate signal 130 that is provided to the second laser 112 to adjust the frequency of the second laser 112. In some examples, this acquisition process occurs prior to powering on the control loop. Once the acquisition process is complete (e.g., once the frequency of the two lasers 102, 112 are brought to within the desired nominal range), the operation of the second laser is fixed to maintain a substantially constant optical frequency and the feedback loop is activated (e.g., by switching the input current output by the logic circuitry 126 from a default value (used during the acquisition process) to a variable value adjusted based on the control loop). Thereafter, the control loop will control the optical frequency of the first laser 102 by adjusting the input current 128 in response to the difference between the optical beat frequency of the first laser 102 relative to the substantially fixed (baseline) frequency of the second laser 112 (as determined by the heterodyne beat signal of the two lasers sensed by the photodetector 118) and the frequency of the reference waveform 127.

In the illustrated example, the entirety of the laser control system 100 of FIG. 1 is implemented in a single monolithic integrated circuit (e.g., a system on a chip (SoC)). That is, each of the first laser 102, the optical splitter 110, the second laser 112, the optical combiner 116, the photodetector 118, the frequency divider 122, and the logic circuitry 126 is manufactured as part of solid state logic circuitry on a common semiconductor substrate. Manufacturing the system 100 as a single integrated circuit is possible because, unlike laser control systems that rely on a Mach-Zehnder interferometer as outlined above, the example laser control system 100 of FIG. 1 does not include an interferometer with a long delay line. Long delay lines are difficult and costly to implement in a photonic integrated circuit and, therefore, are typically implemented using external fiber optic cables tightly wound in a coil. Examples disclosed herein do not include an interferometer with a long delay line. Instead, the illustrated example includes both the first and second lasers 102, 112 that provide light beams to the optical combiner 116 that operates in combination with the photodetector 118 (all of which are standard semiconductor devices capable of being manufactured using solid state semiconductor manufacturing techniques). While it is possible for all the components of the laser control system 100 of FIG. 1 to be implemented in a single integrated circuit, in some examples, one or more of the components may be implemented on separate interconnected chips or circuits. For instance, in some examples, the first and second lasers 102, 112, the optical combiner 116, and the photodetector 118 may be manufactured on a first integrated circuit, while the logic circuitry 126 is implemented on a second different integrated circuit. Other examples may include more than two integrated circuits (ICs). Regardless of the number of ICs employed, in some examples, all of the integrated circuits are enclosed in a single chip carrier package (e.g., a system-in-a-package (SiP)). In other examples, the integrated circuits are associated with different packages.

Figure 2:
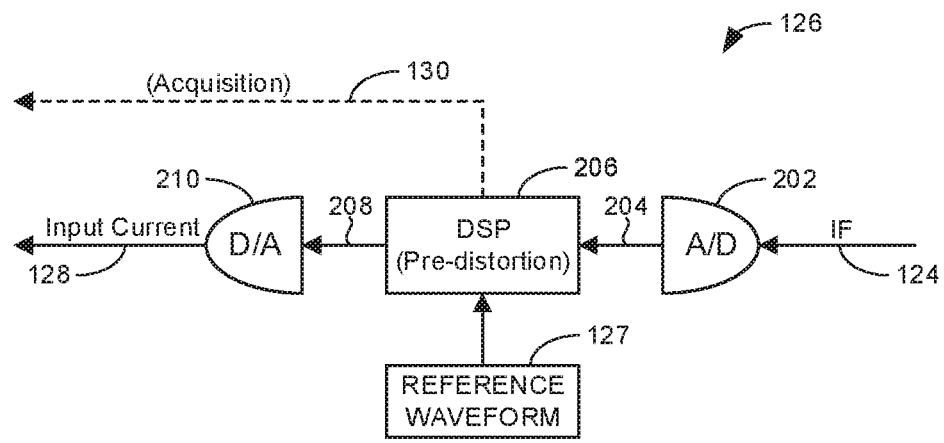
FIG. 2 illustrates an example implementation of the example logic circuitry of the example laser control system of FIG. 1.

The example logic circuitry 126 of FIG. 1 may be implemented in any suitable manner. For instance, the example logic circuitry 126 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). One example implementation of the logic circuitry 126 is illustrated in FIG. 2. As shown in the illustrated example, the logic circuitry 126 includes an analog-to-digital converter 202 to convert the reduced feedback signal 124 (or the initial feedback signal 120 if the frequency divider 122 is not used) to a digital input 204 to a digital signal processor (DSP) 206. The DSP 206 may process and/or analyze the digital input 204 in any suitable manner to compare the digital input 204 to a reference waveform 127. The reference waveform 127 may be generated by an oscillator, may be a signal represented in a digital data file stored in memory, or may be computed by the DSP 206. Based on the comparison, the example DSP generates a digital output 208 that passes through a digital-to-analog converter 210 to produce the input current 128 that is provided to the first laser 102. This process can be successively iterated so that the output of the first laser 102 may be controlled to substantially match the reference waveform. As represented in FIG. 2, the DSP 206 may also generate the acquisition signal 130 used during the acquisition process to adjust the baseline (fixed) frequency of the second laser 112 prior to implementing the control loop. Although the acquisition signal 130 is shown as being generated by the DSP 206, in other examples, the acquisition process may be implemented by a different processor and/or different logic circuitry separate from the DSP 206 and/or separate from the logic circuitry 126.

Figure 3:
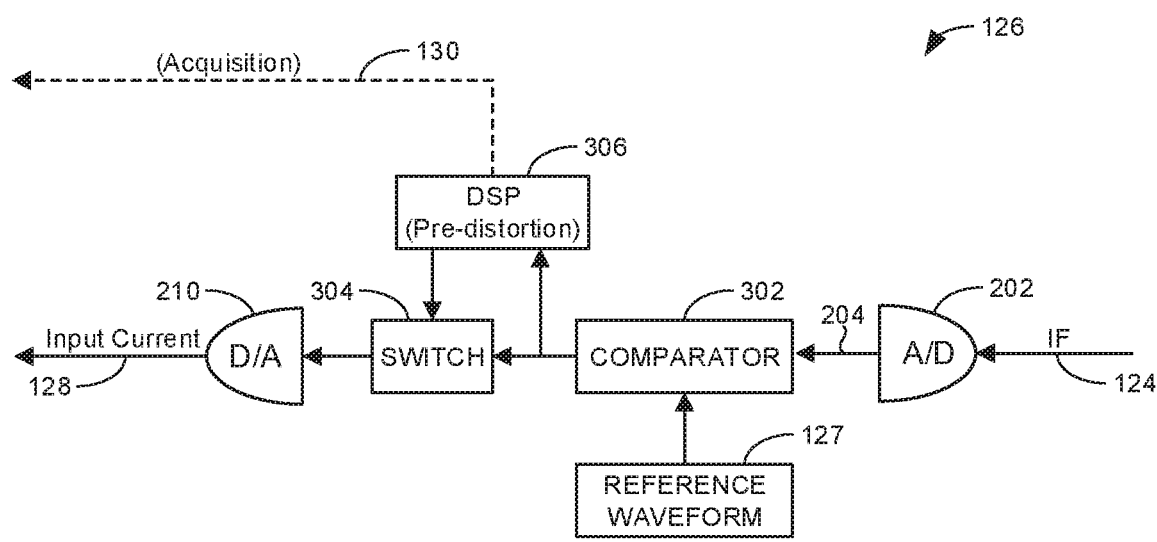
FIG. 3 illustrates another example implementation of the example logic circuitry of the example laser control system of FIG. 1.

Another example implementation of the logic circuitry 126 is illustrated in FIG. 3. As shown in the illustrated example of FIG. 3, a comparator 302 receives the digital input 204 and compares the input against the reference waveform 127. In some examples, the output of the comparator 302 is provided to a switch 304 that is controlled by a DSP 306. In this example, the output of the comparator 302 is also provided to the DSP 306 to enable the DSP to determine how to control the switch 304. If the output of the comparator 302 is too large (e.g., exceeds a threshold), the DSP 306 may determine that the acquisition process needs to continue. As such, the DSP 306 may generate the acquisition signal 130 and control the switch 304 to provide a default value to the digital-to-analog converter 210 to produce a default input current 128 used to drive the first laser 102. Once the DSP 306 determines that the output of the comparator 302 is within the relevant threshold (indicating the acquisition process is complete), the DSP 306 may control the switch 304 to pass the comparator output to the digital-to-analog converter 210 as the basis for the input current 128. Thus, as the output of the comparator 302 changes (based on the difference between the heterodyne beat signal of the two lasers and the reference waveform 127), the input current 128 will correspondingly change so that the output of the first laser 102 may be controlled to substantially match the reference waveform.

While an example manner of implementing the laser control system 100 is illustrated in FIG. 1 (with alternate example implementations of the logic circuitry 126 illustrated in FIGS. 2 and 3), the example laser control system 100 may include one or more elements, processes and/or devices in addition to, or instead of, those illustrated in FIGS. 1, 2, and/or 3, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 4:
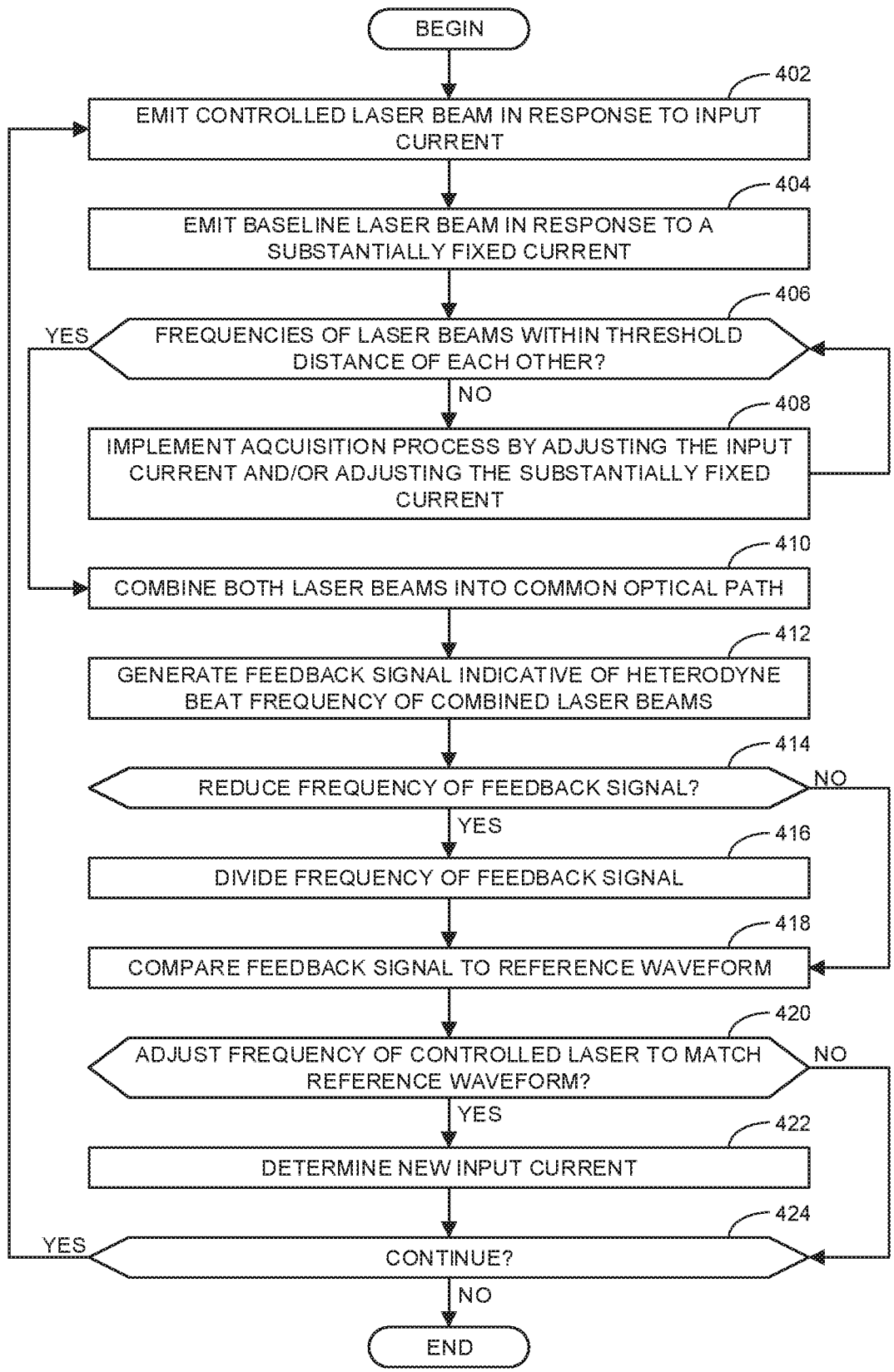
FIG. 4 is a flowchart representative of an example method to implement the example laser control system of FIG. 1.

A flowchart representative of an example method of implementing the laser control system 100 of FIG. 1 is shown in FIG. 4. Although the example method is described with reference to the flowchart illustrated in FIG. 4, many other methods of implementing the example laser control system 100 may alternatively be used. For example, the order of execution of the blocks may be changed, and/or some of the blocks described may be changed, eliminated, or combined.

The example process of FIG. 4 begins at block 402 where the first laser 102 emits a controlled laser beam (e.g., the controlled beam of light 104) in response to an input current (e.g., the input current 128). At block 404, the second (e.g., reference) laser 112 emits a baseline laser beam (e.g., the baseline beam of light 114) in response to a substantially fixed current. The substantially fixed current provided to the second laser 112 ensures that the baseline beam of light 114 is associated with a substantially fixed or constant optical frequency. In some examples, both the input current provided to the first laser 102 and the substantially fixed current provided to the second laser 112 are controlled and/or generated by the logic circuitry 126.

At block 406, the example logic circuitry 126 determines whether the frequencies of the laser beams 104, 114 are within a nominal range or threshold distance of each other. If not, control advances to block 408 where the logic circuitry 126 implements an acquisition process by adjusting the input current and/or adjusting the substantially fixed current. Thereafter, control returns to block 406. If, at block 406, the logic circuitry 126 determines that the frequencies of the laser beams 104, 114 are within a threshold distance of each other, control advances to block 410.

At block 410, the example optical combiner 116 combines both of the laser beams 104, 114 into a common optical path. More particularly, in some examples, a sample portion 108 of the first beam of light 104 is combined with the baseline beam of light 114. At block 412, the example photodetector 118 generates a feedback signal (e.g., the RF output signal 120) indicative of the heterodyne beat frequency (e.g., the frequency difference) of the combined laser beams 108, 114. The frequency of the feedback signal corresponds to the heterodyne beat frequency of the laser beams 108, 114. At block 414, the example frequency divider 122 determines whether to reduce the frequency of the feedback signal. In some examples, this determination is made based on whether the frequency of the feedback signal satisfies (e.g., exceeds) a threshold. If so, control advances to block 416 where the example frequency divider 122 divides the frequency of the feedback signal. Thereafter, control advances to block 418. If the frequency divider 122 determines not to reduce the frequency of the feedback signal (block 414), control advances directly to block 418. In some examples, where the frequency divider 122 is omitted from the laser control system 100, blocks 414 and 416 may be omitted.

At block 418, the example logic circuitry 126 compares the feedback signal to a reference waveform. At block 420, the example logic circuitry 126 determines whether to adjust the frequency of the controlled laser beam 104 to match the reference waveform. If so, control advances to block 422 where the example logic circuitry 126 determines a new input current for the first laser 102. Thereafter, control advances to block 424. If the example logic circuitry 126 determines not to adjust the frequency of the controlled laser beam 104 (block 420), the input current remains as it is (as previously applied at block 402) and control advances directly to block 424. At block 424, it is determined whether to continue the process. If so, control returns to block 402 where the first laser 102 emits the controlled laser beam in response to the input current (as newly determined at block 422 or previously applied as determined at block 420). If the process is not to continue at block 424, the example process of FIG. 4 ends.

Figure 5:
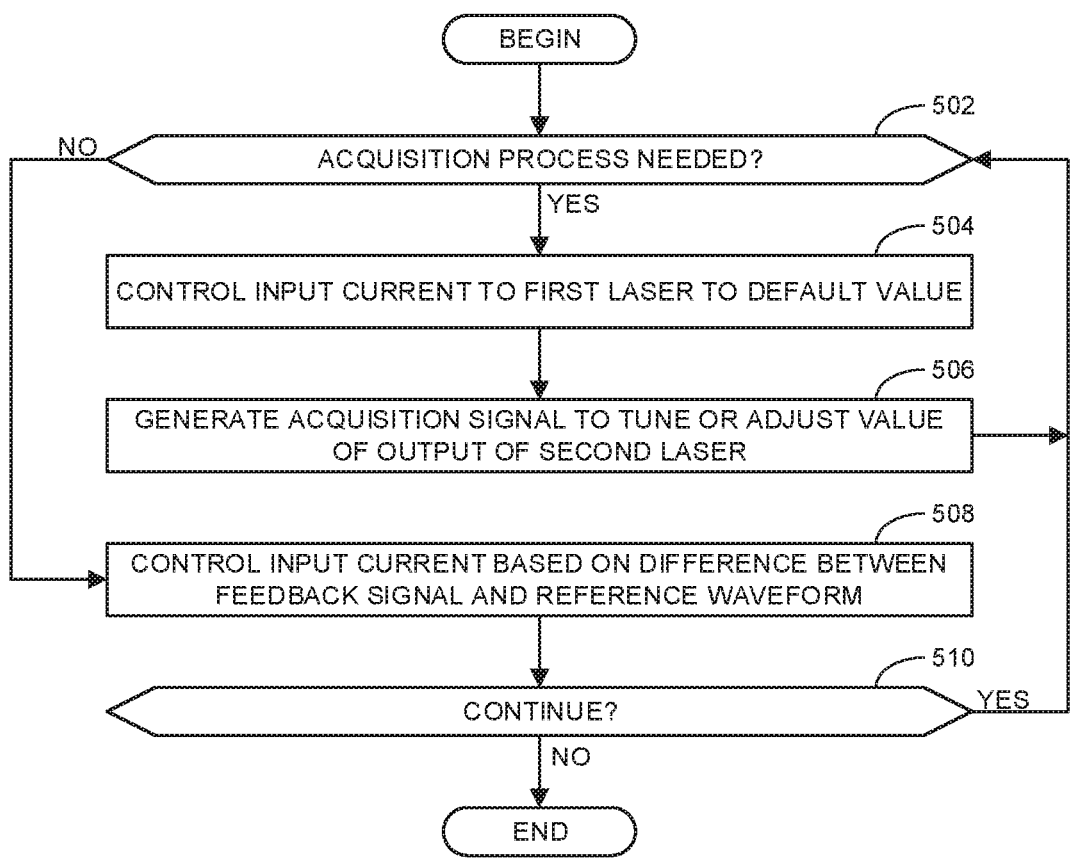
FIG. 5 is a flowchart representative of machine readable instructions which may be executed to implement the example digital signal processor of FIGS. 2 and/or 3.

A flowchart representative of example hardware logic, machine readable instructions, hardware implemented state machines, and/or any combination thereof for implementing the DSP 206 of FIGS. 2 and/or 3 is shown in FIG. 5. The machine readable instructions may be one or more executable programs or portion(s) of an executable program for execution by a computer processor (e.g., the DSP 206). The program may be embodied in software stored on a non-transitory computer readable storage medium such as a CD-ROM, a floppy disk, a hard drive, a DVD, a Blu-ray disk, or a memory associated with the processor, but the entire program and/or parts thereof could alternatively be executed by a device other than the processor and/or embodied in firmware or dedicated hardware. Further, although the example program is described with reference to the flowchart illustrated in FIG. 5, many other methods of implementing the example DSP 206 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIG. 5 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

The process of FIG. 5 begins at block 502 where the example DSP 206 determines whether an acquisition process is needed. In some examples, the DSP 206 determines this directly from the feedback signal 120, 124. In other examples, the DSP 206 makes this determination based on an output of the example comparator 302. If the acquisition process is needed, control advances to block 504 where the example DSP 206 controls the input signal 128 to the first laser 102 to a default value. At block 506, the example DSP 206 generates the acquisition signal 130 to tune or adjust the value of the substantially constant frequency of the output of the second laser 112. Thereafter, control returns to block 502.

If, at block 502, the DSP 206 determines that the acquisition process is not needed, control advances to block 508 where the DSP 206 controls the input current 128 based on the difference between the feedback signal 120, 124 and the reference waveform 127. In some examples, the DSP 206 generates the input current 128 directly (or, more particularly, generates an output signal that is converted by the digital-to-analog converter 210 into the input current 128). In other examples, the DSP 206 controls the input current 128 indirectly by controlling the switch 304 to pass the output of the comparator 302 to the digital-to-analog converter 210. At block 510, the example DSP 206 determines whether to continue the process. If so, control returns to block 502. Otherwise, the example process of FIG. 5 ends.

Figure 6:
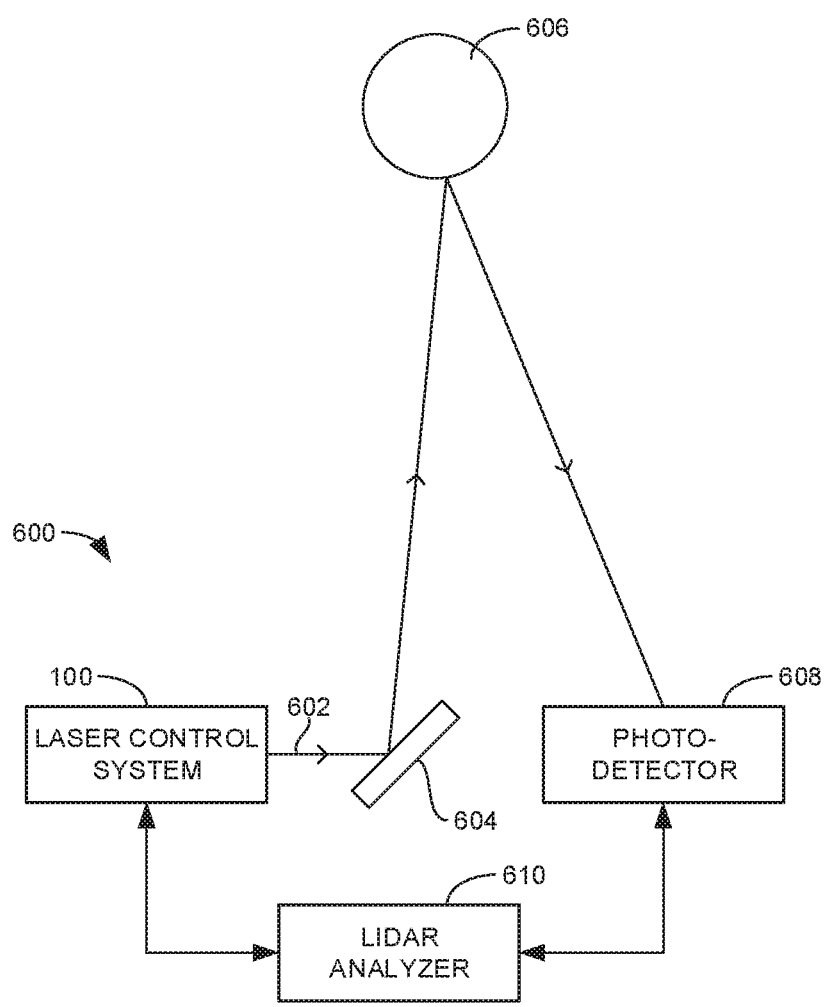
FIG. 6 is a block diagram of an example light detection and ranging (LIDAR) system that implements the example laser control system of FIG. 1.

The example laser control system 100 of FIG. 1 and the associated methods of operation outlined in FIGS. 4 and/or 5 may be applied in any suitable situation where the optical frequency of a laser is to be precisely controlled. One example application for the laser control system 100 is within a light detection and ranging (LIDAR) system 600 as shown in the illustrated example of FIG. 6. More particularly, the example LIDAR system 600 includes the laser control system 100 of FIG. 1 to generate frequency modulated pulses or chirps of light 602 corresponding to the first portion 106 of the controlled beam of light 104 of FIG. 1. In some examples, the frequency modulated chirps 602 are directed to a scanner 604 (e.g., one or more oscillating mirrors and/or other optical devices) that deflects the chirps in a direction where target objects 606 are to be detected. For instance, the example LIDAR system 600 may be implemented on a vehicle with the scanner 604 arranged to deflect the chirps 602 to an area surrounding the vehicle (e.g., in front of the vehicle, behind the vehicle, to the side of the vehicle, etc.). When the chirps 602 hit the target object 606, the light is reflected back towards the LIDAR system 600 and detected by the photodetector 608. Based on the time delay or frequency difference between a particular chirp 602 being emitted and the same chirp 602 being sensed by the photodetector 608, as determined by a LIDAR analyzer 610, the distance and location of the object 606 can be determined. The use of chirps 602 that vary in frequency in a controlled manner, as disclosed herein, improves LIDAR systems by also enabling the LIDAR analyzer 610 to determine the velocity and direction of travel of the object 606. Furthermore, LIDAR systems based on frequency modulated chirps 602 are much less susceptible to false detections based on noise and interference.

From the foregoing, it will be appreciated that example methods, apparatus and articles of manufacture have been disclosed that enable the precise control of the optical frequency of lasers without using an interferometer with a long delay line in one of its signal paths. The elimination of such an interferometer enables example laser control systems to be manufactured entirely within a single monolithic photonic integrated circuit, thereby reducing the size, cost, and/or complexity of laser devices.

Example methods, apparatus, systems, and articles of manufacture to control the optical frequency of a laser are disclosed herein. Further examples and combinations thereof include the following:

Example 1 includes an apparatus comprising a first laser to emit a first beam of light, the first beam of light to have an adjustable frequency based on an input current, a second laser to emit a second beam of light, the second beam of light to have a substantially fixed frequency, a photodetector to generate a feedback signal indicative of a frequency difference between the first and second beams of light, and logic circuitry to control the input current based on the feedback signal.

Example 2 includes the apparatus of example 1, further including an optical combiner to combine at least a portion of the first beam of light with the second beam of light, the photodetector to generate the feedback signal based on an output of the combiner, the feedback signal corresponding to a beat frequency of the combined first and second beams of light.

Example 3 includes the apparatus of example 2, wherein the optical combiner is an optical coupler in a monolithic integrated circuit, the monolithic integrated circuit including the first laser, the second laser, the optical coupler, and the photodetector.

Example 4 includes the apparatus of any one of examples 2 or 3, wherein the beat frequency is within the radio frequency spectrum.

Example 5 includes the apparatus of any one of examples 2-4, wherein the feedback signal generated by the photodetector is to have a feedback frequency corresponding to the beat frequency.

Example 6 includes the apparatus of example 5, further including a frequency divider to reduce the feedback frequency to an intermediate frequency, the logic circuitry to control the input current based on the intermediate frequency.

Example 7 includes the apparatus of example 6, wherein the frequency divider is to reduce the feedback frequency to the intermediate frequency when the beat frequency exceeds a threshold.

Example 8 includes the apparatus of any one of examples 1-7, wherein the logic circuitry includes an analog-to-digital converter to convert the feedback signal generated by the photodetector to a digital signal, a digital signal processor to generate an output signal based on the digital signal, and a digital-to-analog converter to produce the input current based on the output signal.

Example 9 includes the apparatus of any one of examples 1-8, wherein the logic circuitry is to compare the frequency difference with a reference waveform, and control the input current based on a deviation between the reference waveform and the frequency difference.

Example 10 includes the apparatus of example 9, wherein the reference waveform includes a frequency modulated linear chirp.

Example 11 includes the apparatus of any one of examples 1-10, further including an optical coupler to sample a first portion of the first beam of light and enable a second portion of the first beam of light to pass to an external environment, the photodetector to detect the frequency difference based on the first portion of the first beam of light.

Example 12 includes the apparatus of example 11, wherein the apparatus includes a light detection and ranging (LIDAR) system, the LIDAR system to detect objects in the environment using the first beam of light.

Example 13 includes the apparatus of any one of examples 1-12, wherein the adjustable frequency of the first beam of light is to be nominally within 10 gigahertz of the substantially fixed frequency of the second beam of light.

Example 14 includes the apparatus of any one of examples 1-13, wherein the logic circuitry is to adjust the substantially fixed frequency of the second beam of light during an acquisition process prior to controlling the input current.

Example 15 includes the apparatus of any one of examples 1-14, wherein the apparatus does not include an interferometer.

Example 16 includes the apparatus of any one of examples 1-15, wherein the apparatus is contained within a single integrated circuit package.

Example 17 includes a laser control system comprising a semiconductor laser to emit a beam of light in response to an input current, a photodetector to generate a feedback signal based on the beam of light, the feedback signal indicative of a frequency of the beam of light, the photodetector to generate the feedback signal without an interferometer, and logic circuitry to adjust the input current based on the feedback signal.

Example 18 includes the laser control system of example 17, wherein the semiconductor laser is a first semiconductor laser and the beam of light is a first beam of light, the laser control system further including a second semiconductor laser to emit a second beam of light at a substantially constant frequency, and an optical combiner to combine the at least a portion of the first beam of light with the second beam of light, the photodetector to generate the feedback signal based on an output of the optical combiner, the feedback signal to have a feedback frequency corresponding to a heterodyne beat frequency associated with the combined first and second beams of light, the logic circuitry to vary the input current based on the beat frequency.

Example 19 includes the laser control system of example 18, wherein the first semiconductor laser, the second semiconductor laser, the optical combiner, and the photodetector are included in a single integrated circuit.

Example 20 includes the laser control system of any one of examples 18 or 19, wherein the substantially constant frequency of the second beam of light is adjustable to be within a threshold distance of the frequency of the first beam of light, the threshold distance being less than 100 GHz.

Example 21 includes the laser control system of any one of examples 18-20, further including a frequency divider to divide the feedback frequency of the feedback signal to an intermediate frequency, the logic circuitry to adjust the input current based on the intermediate frequency.

Example 22 includes the laser control system of any one of examples 17-21, wherein the logic circuitry is to adjust the input current based on a reference waveform.

Example 23 includes an apparatus comprising means for emitting a first laser beam having a frequency adjustable in response to an adjustable input current, means for emitting a second laser beam at a substantially fixed frequency, means for generating a feedback signal indicative of a frequency difference between the first and second laser beams, and means for controlling the input current based on the feedback signal.

Example 24 includes the apparatus of example 23, further including means for combining the first and second laser beams, the generating means to generate the feedback signal based on an output of the combining means.

Example 25 includes the apparatus of example 24, wherein the first laser beam emitting means, the second laser beam emitting means, the combining means, and the generating means are included in a solid state integrated circuit.

Example 26 includes the apparatus of any one of examples 24 or 25, further including means for dividing a frequency of a signal, the dividing means to reduce an initial frequency of the feedback signal generated by the generating means to an intermediate frequency, the controlling means to control the input current based on the intermediate frequency.

Example 27 includes the apparatus of any one of examples 23-26, wherein the controlling means is to control the input current to reduce a difference between the frequency of the first laser beam and a reference waveform.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
a first laser to emit a first beam of light, the first beam of light to have an adjustable frequency based on an input current;
a second laser to emit a second beam of light, the second beam of light to have a substantially fixed frequency;
a photodetector to generate a feedback signal indicative of a frequency difference between the first and second beams of light; and
logic circuitry to:
in response to the frequency difference being above a threshold, adjust the substantially fixed frequency of the second beam of light during an acquisition process; and
control the input current based on the feedback signal after the acquisition process.

2. The apparatus of claim 1, further including an optical combiner to combine at least a portion of the first beam of light with the second beam of light, the photodetector to generate the feedback signal based on an output of the combiner, the feedback signal corresponding to a beat frequency of the combined first and second beams of light.

3. The apparatus of claim 2, wherein the optical combiner is an optical coupler in a monolithic integrated circuit, the monolithic integrated circuit including the first laser, the second laser, the optical coupler, and the photodetector.

4. The apparatus of claim 2, wherein the beat frequency is within the radio frequency spectrum.

5. The apparatus of claim 2, wherein the feedback signal generated by the photodetector is to have a feedback frequency corresponding to the beat frequency.

6. The apparatus of claim 5, further including a frequency divider to reduce the feedback frequency to an intermediate frequency, the logic circuitry to control the input current based on the intermediate frequency.

7. The apparatus of claim 6, wherein the frequency divider is to reduce the feedback frequency to the intermediate frequency when the beat frequency exceeds a threshold.

8. The apparatus of claim 1, wherein the logic circuitry includes:
an analog-to-digital converter to convert the feedback signal generated by the photodetector to a digital signal;
a digital signal processor to generate an output signal based on the digital signal; and
a digital-to-analog converter to produce the input current based on the output signal.

9. The apparatus of claim 1, wherein the logic circuitry is to:
compare the frequency difference to a reference waveform; and control the input current based on a deviation between the reference waveform and the frequency difference.

10. The apparatus of claim 1, further including an optical coupler to sample a first portion of the first beam of light and enable a second portion of the first beam of light to pass to an external environment, the photodetector to detect the frequency difference based on the first portion of the first beam of light.

11. The apparatus of claim 10, wherein the apparatus includes a light detection and ranging (LIDAR) system, the LIDAR system to detect objects in the environment using the first beam of light.

12. The apparatus of claim 1, wherein the adjustable frequency of the first beam of light is to be nominally within 10 gigahertz of the substantially fixed frequency of the second beam of light.

13. The apparatus of claim 1, wherein the apparatus is contained within a single integrated circuit package.

14. A laser control system comprising:
a semiconductor laser to emit a first beam of light, the first beam of light to have a first frequency controlled in response to an input current;
a photodetector to generate a feedback signal based on a frequency difference between the first frequency of the first beam of light and a second frequency of a second beam of light, the feedback signal indicative of the first frequency of the first beam of light, the photodetector to generate the feedback signal without an interferometer; and
logic circuitry to:
in response to the frequency difference being above a threshold, adjust the second frequency of the second beam of light during an acquisition process; and
adjust the input current based on the feedback signal after the acquisition process.

15. The laser control system of claim 14, wherein the semiconductor laser is a first semiconductor laser, the laser control system further including:
a second semiconductor laser to emit the second beam of light, the second frequency to be at a substantially constant frequency; and
an optical combiner to combine the at least a portion of the first beam of light with the second beam of light, the photodetector to generate the feedback signal based on an output of the optical combiner, the feedback signal to have a feedback frequency corresponding to a heterodyne beat frequency associated with the combined first and second beams of light, the logic circuitry to vary the input current based on the beat frequency.

16. The laser control system of claim 15, wherein the first semiconductor laser, the second semiconductor laser, the optical combiner, and the photodetector are included in a single integrated circuit.

17. The laser control system of claim 15, wherein the substantially constant frequency of the second beam of light is adjustable to be within a threshold distance of the first frequency of the first beam of light, the threshold distance being less than 100 GHz.

18. The laser control system of claim 15, further including a frequency divider to divide the feedback frequency of the feedback signal to an intermediate frequency, the logic circuitry to adjust the input current based on the intermediate frequency.

19. The laser control system of claim 14, wherein the logic circuitry is to adjust the input current based on a reference waveform.

20. An apparatus comprising:
means for emitting a first laser beam having a frequency adjustable in response to an adjustable input current;
means for emitting a second laser beam at a substantially fixed frequency;
means for generating a feedback signal indicative of a frequency difference between the first and second laser beams; and
means for controlling the input current based on the feedback signal after an acquisition process during which the controlling means is to adjust the substantially fixed frequency of the second laser beam.

21. The apparatus of claim 20, further including means for combining the first and second laser beams, the generating means to generate the feedback signal based on an output of the combining means.

22. The apparatus of claim 21, wherein the first laser beam emitting means, the second laser beam emitting means, the combining means, and the generating means are included in a solid state integrated circuit.

23. The apparatus of claim 21, further including means for dividing a frequency of a signal, the dividing means to reduce an initial frequency of the feedback signal generated by the generating means to an intermediate frequency, the controlling means to control the input current based on the intermediate frequency.

24. The apparatus of claim 20, wherein the controlling means is to control the input current to reduce a difference between the frequency of the first laser beam and a reference waveform.

25. The apparatus of claim 9, wherein the reference waveform includes a frequency modulated linear chirp.

* * * * *